United States Patent [19]
Vohra et al.

[11] Patent Number: 5,628,824
[45] Date of Patent: May 13, 1997

[54] HIGH GROWTH RATE HOMOEPITAXIAL DIAMOND FILM DEPOSITION AT HIGH TEMPERATURES BY MICROWAVE PLASMA-ASSISTED CHEMICAL VAPOR DEPOSITION

[75] Inventors: Yogesh K. Vohra; Thomas S. McCauley, both of Birmingham, Ala.

[73] Assignee: The University of Alabama at Birmingham Research Foundation, Birmingham, Ala.

[21] Appl. No.: 406,196

[22] Filed: Mar. 16, 1995

[51] Int. Cl.⁶ .................................................. C30B 29/04
[52] U.S. Cl. ........................ 117/101; 117/104; 117/929; 423/446
[58] Field of Search ................................. 117/101, 104, 117/929; 423/446; 427/570

[56] References Cited

U.S. PATENT DOCUMENTS

| | | | |
|---|---|---|---|
| 4,767,608 | 8/1988 | Matsumoto et al. | 117/929 |
| 5,174,983 | 12/1992 | Snail | 117/929 |
| 5,188,862 | 2/1993 | Itatani et al. | 117/929 |
| 5,217,700 | 6/1993 | Kurihara et al. | 117/929 |
| 5,372,799 | 12/1994 | Adschiri et al. | 117/929 |
| 5,381,755 | 1/1995 | Glesener et al. | 117/84 |

FOREIGN PATENT DOCUMENTS 3-16998  1/1991  Japan ............................. 117/929

OTHER PUBLICATIONS

Bachmann and Lydtin, "High Rate Versus Low Rate Diamond CVD Methods," *Diamond and Diamond–Like Films and Coatings*, R.E. Clausing et al. (ed.), Plenum Press, New York, pp. 829–853, 1991.

McCauley and Vohra, "Homoepitaxial Diamond Film Deposition on a Brilliant Cut Diamond Anvil," *Appl. Phys. Lett.*, 66(12):6–8, Mar. 1995.

Snail and Hanssen, "High Temperature, High Rate Homoepitaxial Growth of Diamond in an Atmospheric Pressure Flame," *Journal of Crystal Growth*, 112:651–659, 1991.

*Primary Examiner*—Robert Kunemund
*Attorney, Agent, or Firm*—Benjamin Aaron Adler

[57] ABSTRACT

The deposition of high quality diamond films at high linear growth rates and substrate temperatures for microwave-plasma chemical vapor deposition is disclosed. The linear growth rate achieved for this process is generally greater than 50 μm/hr for high quality films, as compared to rates of less than 5 μm/hr generally reported for MPCVD processes.

33 Claims, 1 Drawing Sheet ns, 1981; Pate, 1986). This belief was further reinforced by observations of graphitic inclusions and/or growth on diamond and non-diamond substrates held at temperatures above 1000°–1100° C. in low pressure CVD environments. (Spitsyn et al., 1981; Zhu et al., 1989).
HIGH GROWTH RATE HOMOEPITAXIAL DIAMOND FILM DEPOSITION AT HIGH TEMPERATURES BY MICROWAVE PLASMA-ASSISTED CHEMICAL VAPOR DEPOSITION The U.S. Government owns rights in the present invention pursuant to grant number DMR-9403832 from the National Science Foundation and Alabama NASA-EPSCOR program.

BACKGROUND OF THE INVENTION

The present invention relates generally to the fields of chemical vapor deposition (CVD) using low pressure techniques and the growth of diamond films. More particularly, it concerns the use of microwave plasma-assisted CVD (MPCVD) to grow epitaxial diamond films at high temperatures (>1600° C.).

The growth of homoepitaxial diamond films for integrated and optoelectronic applications is currently an active area of diamond research. (Ravi, 1993). Metastable synthesis of high quality single-crystal diamond from the vapor phase is complicated by several technological and theoretical factors. Among these are the incorporation of large concentrations of optically active defect centers (Collins and Lawson, 1989; Clark et al., 1992) (many involving nitrogen), and the lack of an accurate model for nucleation, growth, and surface chemistry during diamond film deposition.

The primary goal for large-scale production of diamond-based electronics is to develop the most reliable and economical deposition technology possible. Chemical vapor deposition (CVD) using low pressure techniques, such as microwave plasma-assisted CVD (MPCVD), are attractive for their reasonable capital investment, process flexibility and automation, and their demonstrated ability to produce high quality epitaxial films. (Sato and Kamo, 1992). In addition, given a sufficient growth rate ($\geq 20$ µm/hr), diamond homoepitaxy could be used in the enlargement, modification, or repair of existing natural and high pressure/high temperature synthesized (HPHT) crystals for use in many applications, such as repair of diamond anvils for high pressure research. (Vohra and Vagarali, 1992).

The most common characterization techniques for determining the phase purity and crystallinity of diamond films is by Raman spectroscopy. (Bachmann and Wechert, 1991; Knight and White, 1989). The absolute position and full width at half-maximum (FWHM) of the first order zone-center phonon mode (found at ~1332.5 cm$^{-1}$ in natural type IIa diamond) have been shown to be a semiquantitative means of evaluating the degree and range of crystalline order, and residual stress present in diamond films. (Knight and White, 1989; Boppart et al., 1985). More difficult, but fully quantitative methods of determining the crystallinity and crystallographic orientation of a film or crystal are Laue, x-ray, or electron diffraction techniques. (Bachmann and Wechert, 1991). Defect and impurity complexes are usually studied by photoluminescence (PL) or cathodoluminescence (CL), and are labeled by the characteristic energy $E_{zpl}$ (Energy of the "zero phonon line") of the zero phonon (purely electronic) transition of the center. (Clark et al., 1992).

The most common defect/impurity complexes found in both bulk and thin film diamond involve nitrogen (substitutional or interstitial) and lattice vacancies. Recent studies using isotope labeled precursor gases have indicated the enhanced incorporation of nitrogen-related defects at the film/substrate interface, as determined by intensity maxima in the ZPLs of two defect centers at 2.16 eV (575 nm) and 2.21 eV (560 nm). (Behr et al., 1993).

It has been generally understood that the growth of epitaxial diamond could not be accomplished with low pressure CVD and combustion processes at substrate temperatures in excess of 1200° C. (Bachmann and Lydtin, 1991). This belief, based in part on thermal desorption studies of diamond powders, was that the upper temperature limit would be due to the desorption of atomic hydrogen and the subsequent reconstruction and graphitization of the diamond surface. (Matsumoto et al., 1981; Pate, 1986). This belief was further reinforced by observations of graphitic inclusions and/or growth on diamond and non-diamond substrates held at temperatures above 1000°–1100° C. in low pressure CVD environments. (Spitsyn et al., 1981; Zhu et al., 1989).

The highest substrate temperature for the epitaxial growth of diamond was reported by Snail and Hanssen (1991). They reported diamond growth with a substrate temperature range of 1150°–1500° C. on natural diamond seed crystals using a laminar, premixed oxygen-acetylene flame in air. Growth rates of 100–200 µm/hr were observed for lower temperatures. However, the seed crystals subjected to higher deposition temperatures had larger misorientations and the diamond growth at 1500° C. exhibited a low growth rate and strong graphitic character in the center of one of the seed crystal's faces. Additionally, this reference discusses an open atmosphere method of producing diamond films which leads to contamination of the diamond film by graphite and nitrogen and is therefore disfavored.

SUMMARY OF THE INVENTION

The present invention seeks to overcome these and other drawbacks discussed above by providing a high temperature process for forming relatively pure diamond films, epitaxially and non-epitaxially, at high growth rates, >50 µm/hr. This is the lowest estimated rate, and the actual rate may be as high as 400 µm/hr. with growth rates above 100 µm/hr. being within the scope of this invention. The quality of the diamonds is also very good, having a FWHM of 2–5 cm$^{-1}$ which is comparable to the best films produced by other methods. The production of high quality diamond films with high growth rates would have applicability for electronic and optical devices due to their high thermal conductivity and laser damage threshold.

In one respect the present invention includes a method for the deposition of diamond films onto a substrate comprising: generating a plasma of a diamond forming gas adjacent to a substrate under conditions such that the diamond film forms on the substrate wherein the temperature of the substrate is greater than about 1600° C.

In another respect, this invention is a method for the deposition of diamond film onto a substrate comprising: generating a plasma of methane and hydrogen gas adjacent to a diamond substrate, the diamond substrate, having a temperature in the range from about 2200° C. to about 2500° C., under conditions such that the diamond film forms on the surface of the diamond substrate.

In yet another respect, this invention is a method for the production of diamond film, comprising: encompassing a substrate with a plasma under conditions such that the diamond film forms on the surface of the substrate, wherein the substrate is heated by the plasma to a temperature of greater than about 1600° C.

In still another respect, this invention is a method for the production of monocrystalline diamond, comprising:

encompassing a diamond anvil substrate, the substrate having a tip extending into the plasma, with a plasma under conditions such that the monocrystalline diamond forms on the tip of the substrate.

Also contemplated within the scope of this invention is a synthetic diamond prepared by encompassing a substrate with a plasma under conditions such that the diamond film forms on the surface of the substrate, wherein the substrate is heated by the plasma to a temperature of greater than about 1600° C.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DETAILED DESCRIPTION OF THE PREFERRED EMBODIMENTS

Figure 1:
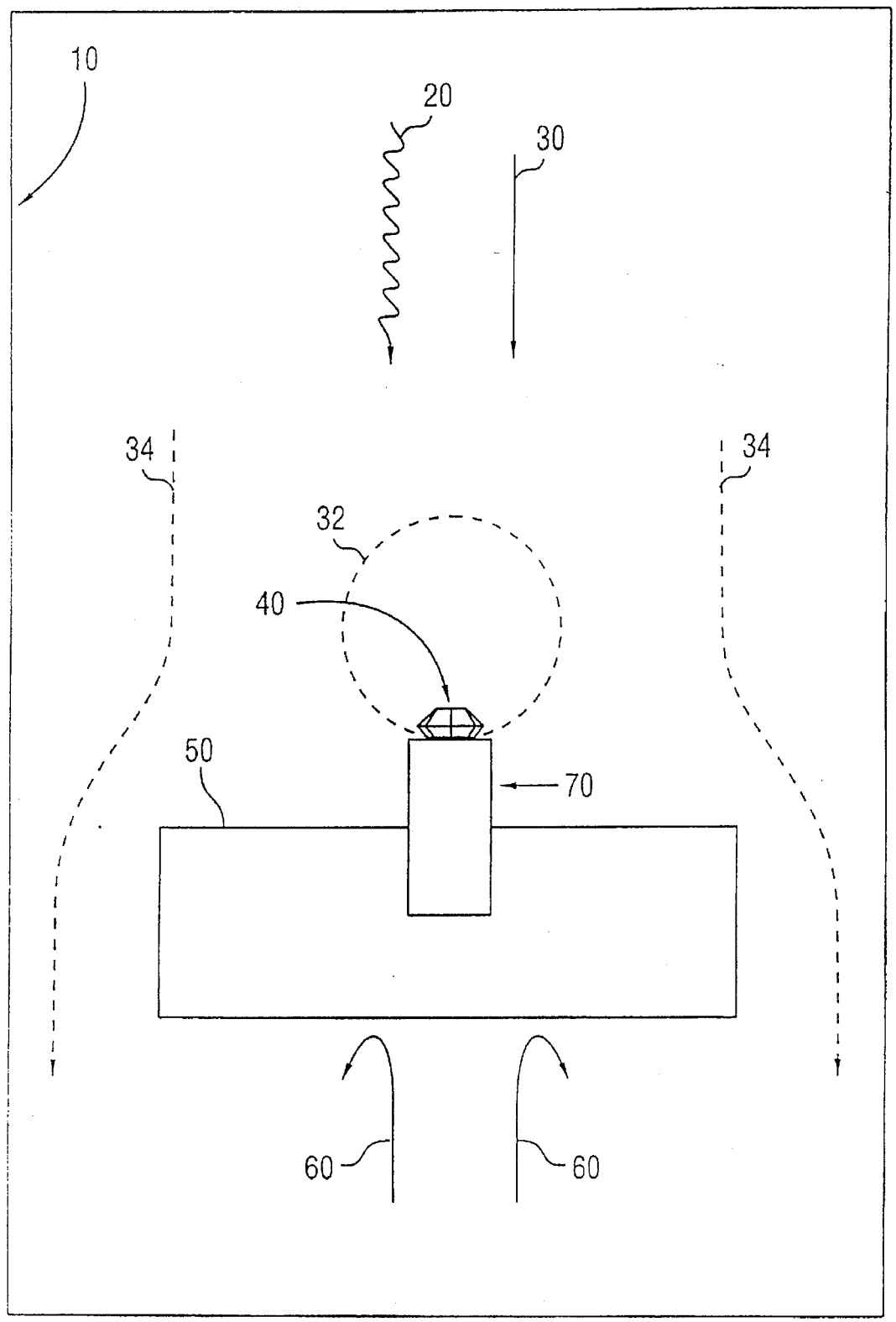
FIG. 1 shows a schematic of a system in accordance with the methods of this invention.

The present invention discloses a method for the deposition of diamond films onto a substrate that is maintained at a high temperature, i.e. at least 1600° C., by generating a plasma of a diamond forming gas adjacent to the substrate.

As used herein the term "plasma" refers to a completely ionized gas which contains equal numbers of ions and electrons. The plasma employed in aspects of the present invention is green, which indicates the presence of the $C_2$ radical. While not wishing to be bound by any theory, it is hypothesized that significant concentrations of $C_2$ radicals in the plasma may be important to facilitate the rapid formation of high quality diamond films. Therefore, the method used for forming the plasma should take this into account.

Although it is envisioned that the most useful way of generating a plasma will be by microwave radiation, other standard techniques for generating plasmas that are typically used for CVD may also be employed, for example, by application of direct current or radio frequency radiation, or employing a DC plasma jet or arc. The method employed in the representative examples provides for the formation of a plasma ball which encompasses the diamond substrate. This is primarily due to the placement of the substrate on a molybdenum screw which facilitates the breakdown of the diamond forming gas into a plasma by its metallic composition and sharp edges. However, other techniques for generating plasmas should also be operable if care is taken to maintain appropriate temperature of the substrate avoiding thermal runaway.

The present invention also envisions the importance of employing a deposition process that is not run in an open atmosphere as this leads to contamination of the diamond film.

Substrates envisioned by this invention will generally require a melting temperature of about 100° C. to 200° C. higher than the temperature at which it is to be maintained during the diamond deposition. Representative examples of such substrates include diamond, boron nitride and molybdenum, with diamond and cubic boron nitride being preferred.

As used herein the term "geometrical structure" refers to the shape of the substrate. Although the substrates used may have any geometrical structure, it is envisioned that particular structures will be more useful. For example, a cubic structure, as is found in cubic boron nitride, an extended planar structure or a brilliant cut structure, such as the single-bevel modified brilliant design as described in Example I, are envisioned as being particularly useful with the brilliant cut being most preferred. While not wishing to be bound by any theory, it is postulated that the non-planar substrate, i.e. the anvil employed in Example I, perturbs the plasma such that gas phase conditions were modified in a manner that facilitates the depositions of diamond as opposed to deposition of graphitic carbon. Therefore, substrates which have sharp points or protrusion into the plasma may be the most useful for facilitating rapid diamond deposition. These sharp points also allow for very high surface temperatures to be attained on the substrate.

As used herein the phrase "diamond forming gas" refers to compounds that are generally employed in the art of CVD for the purposes of depositing diamond onto substrates. Diamond forming gas generally contains a carbon containing substance and a carrier substance that are gaseous under the plasma conditions. Many appropriate carbon containing substances, such as hydrocarbons, are known in the art. Organic compounds containing 5 or fewer carbon atoms are preferred due to their higher volatility, availability, and cost. Examples of hydrocarbons that are particularly useful are acetylene, ethylene, propane and methane, with methane being the most preferred. Carbon compounds that form $C_2$ radicals under plasma conditions in the practice of this invention are envisioned as being most useful. Additionally, as it is postulated that the role of hydrogen gas is of reduced significance in the deposition of diamond, carbon containing compounds that are more carbon rich, i.e. high carbon to hydrogen ratios, may prove to be very useful.

As used herein the term "carrier substance" refers to substances which can be mixed with carbon containing substances to facilitate diamond film formation. It has been hypothesized that these substances serve many purposes, such as to stabilize the diamond surface, reduce the size of the critical nucleus, "dissolve" the carbon in the gas, generate condensable carbon radicals, etc. (Anthony, 1990.) However, this invention does not require desorbed hydrogen on the diamond surface and some of the limitations on carrier substances noted above may not be applicable to the present invention.

Although a preferred embodiment of this invention involves the use of hydrogen gas as the carrier substance, it is envisioned that other gases used alone or in combination with each other and hydrogen may be even more valuable. Carrier gases which facilitate the production of $C_2$ radicals and are able to etch the nanocrystalline graphite formed on the surface of the diamond film are envisioned to be most useful. While not wishing to be bound by any theory, it is postulated that gases such as halogens will be particularly useful as they have a lower dissociation energy than hydrogen and therefore their incorporation into the plasma will increase the plasma density and greater facilitate the deposition of diamond onto substrate.

Although there is no set upper limit on the percentage of carbon containing substance in the diamond forming gas that may be employed, compositions of diamond forming gas with up to about 50% by volume of a carbon containing substance are preferred. Percentages of from about 1 to about 10% are more preferred, with percentages from about 1 to about 3% being most preferred.

A preferred embodiment of this invention maintains the temperature of the substrate at above about 1600° C., more preferably above about 2000° C. A preferred embodiment of this invention maintains the substrate below about 3000° C., more preferably below about 2500° C. and even more preferably about 2200° C. It is postulated that the temperature is important to fine tuning the rates of the deposition of diamond versus the formation of nanocrystalline graphite. Thus, it is envisioned that a temperature range that will maximize the former while minimizing the latter will be particularly useful in the present invention.

A preferred embodiment of the present invention encompasses a method for the deposition of diamond films onto a substrate by generating a plasma, preferably by microwave radiation, of methane and hydrogen gas adjacent to a diamond substrate, which is preferably a brilliant cut diamond, while maintaining the substrate at a temperature of from about 2000° C. to about 2200° C. The preferred concentration of methane in the diamond forming gas is from about 1 to about 3%.

The process of this invention can be further illustrated with reference to FIG. 1 which shows a microwave CVD system of this invention. In FIG. 1, process gases 20, such as a mixture containing 2% methane in hydrogen, flow into water-cooled electroplated stainless steel vacuum chamber 10 via conduits not shown at flow rates of, for example, about 100 to 1000 sccm for methane and about 1 to about 100 sccm for hydrogen. The line of gas flow 34 is depicted in dashed line, which flow toward a vacuum pump, not shown.

The vacuum pump (or pumps) provide an initial pressure in the chamber 10 in the range from about 1 to about 100 Torr prior to introduction of process gases 30, and maintain a low pressure during diamond production, generally in the subatmospheric regime and more typically below about 200 Torr, preferably below about 150 Torr, more preferably below about 100 Torr; typically above about 10 Torr, preferably above about 50 Torr. Prior to introduction of process gases 30, the chamber 10 may be purged of contaminants such as air by repeated evacuation by pumping followed by purging with argon.

Microwaves 20 from a microwave generating device not shown, such as 1.2 kW device generating 2.45 Ghz microwaves, radiate the substrate 40, substrate stage 70 (such as a molybdenum stage) and copper heat sink 50. Alternatively, a higher power microwave generating device can be employed, such as a 6 kW source, which would, it is thought, provide the ability to radiate a larger surface. The microwaves 20 excite the process gases 30 to form a plasma region 32 (which typically has a green color during the practice of this invention, indicating presence of $C_2$) depicted in dotted line. It should be appreciated to one of skill in the art that the localization of the plasma region 32 arises due to the action of sharp edges on the substrate stage 70 which facilitates production of the plasma 32. While a molybdenum rod is depicted in FIG. 1 for the substrate stage 70, it should be appreciated other configurations are also contemplated such as screw or spring shapes.

The plasma region 32 heats the substrate 40 to a temperature in the desired range. Temperature of the substrate 40 can be measured optically via instrumentation not shown, such as an optical emission spectrometer. Alternatively, a thermocouple can be used to measure temperature, which can be placed within the substrate stage 70. If the temperature of the substrate 40 rises too high for a given temperature, the microwave power can be lowered or the flow of process gas 30 turned off so that the substrate cools.

The diamond film grows on the surface of the substrate 40. The substrate stage 70 and copper heat sink 50 is cooled via lines not shown of a flow of cooling liquid 60 such as water, antifreeze solution such as ethylene glycol, or mixtures thereof.

It is also contemplated that the system shown in FIG. 1 may include an OLCR collimator head/detector housing an IR laser, such as a high intensity argon ion pumped femtosecond Ti:$Al_2O_3$ laser, and IR detector which can be employed when diamond films are produced creating diffused reflection, thereby facilitating measurement of diamond deposition rate.

The following examples are included to demonstrate preferred embodiments of the invention. It should be appreciated by those of skill in the art that the techniques disclosed in the examples that follow represent techniques discovered by the inventor to function well in the practice of the invention, and thus can be considered to constitute preferred modes for its practice. However, those of skill in the art should, in light of the present disclosure, appreciate that many changes can be made in the specific embodiments that are disclosed and still obtain a like or similar result without departing from the spirit and scope of the invention.

EXAMPLE I

Homoepitaxial Diamond Film Deposition on a Brilliant Cut Diamond Anvil

This example describes the deposition of a thick homoepitaxial diamond layer on the (100) tip of a micro-cracked type Ia natural diamond anvil by MPCVD. The crystalline quality, phase purity, and defect distribution of the deposit was studied by micro-Raman and PL spectroscopy. The initial motivation for the present study was the repair and reuse of microcracked diamond anvils by the deposition of a thick homoepitaxial overlayer which can then be repolished to match the anvil's original geometry. This may be possible because the elastic strain field of a diamond anvil under stress extends only to a depth of several tens of microns, while the present work shows that high quality homoepitaxial films as thick as 150 μm can be grown in just a few hours by MPCVD. This methodology may also allow for the growth of millimeter-sized crystals from small seed crystals by homoepitaxial CVD. This would facilitate the production of large single crystals that is much more economical than is currently possible with HPHT synthesis.

The anvil on which deposition was conducted was a 0.3 carat type Ia natural diamond. The crystal was cut and polished in the single-bevel, modified brilliant design by D. Drukker & Zn. N.V. The original angles of the bevel and facets from the (100) central flat were 8.5° and 54.7°, respectively, and the dimensions of the central flat and culet were 20 and 350 μm, respectively. Prior to deposition the culet of the anvil had sustained a circular microcrack (a ring crack) during loading in a diamond anvil cell to pressures of over 250 GPa. The damaged regions appeared dark in an optical micrograph.

The homoepitaxial film was grown by MPCVD using a precursor gas mixture of 2% by volume methane in hydrogen at a chamber pressure of 90 Torr. The base pressure before introduction of the process gases was 1 Torr. The substrate temperature started out at 900° C. and increased to 1300° C. during the course of the 8 hour deposition cycle, as measured by an optical pyrometer.

All micro-Raman and PL measurements were carried out at room temperature using a modified Dilor X-Y spectrometer equipped with a liquid nitrogen-cooled CCD detector. Excitation was provided by the 514.5 nm (2.41 eV) line of an argon ion laser. The spectral resolution of the spectrometer was 3 cm$^{-1}$ for the 1200 g/mm Raman grating, and ~1.5 nm for the 150 g/mm PL grating. All Raman linewidths quoted are fitted values and are uncorrected for the instrumental broadening of the spectrometer. The micro-optical system has a spatial filter which allows us to reduce the depth of focus to as little as 10 µm by closing down the filter's confocal aperture. This control of the probe depth permits investigation of the properties of the overlayer without interference from the substrate. The lateral spatial resolution for all spectra is ~1 µm.

The morphology of the homoepitaxial deposit is complex, showing features both related to and seemingly independent of the substrate geometry. The overlayer, as much as 150 µm thick in certain areas, shows the stepped growth surface expected for homoepitaxy on a polished (100) surface, in addition to a bevel of approximately 6°. The analysis of the growth anisotropy is further complicated by the fact that the optimal growth conditions of temperature, methane concentration, etc., are different for faces of different crystallographic orientation.

As shown by optical micrography, the deposit displayed a roughly cubic (100) central flat over 350 µm in diameter, surrounded by four stepped growth faces at an angle of ~6°, where original had 16 facets at 8.5° around a 20 µm, round (100) flat. The thickness of the deposit was observed by optical micrography. Additionally, the diameter of the culet increased from 350 to ~800 µm in about 8 hr.

The Raman spectrum from the epilayer showed a strong diamond signal at 1332 cm$^{-1}$ with no trace of sp$^2$ bonded carbon. This sp$^3$ phase purity, along with the stepped growth morphology and optical transparency of the deposit, indicates that the growth is epitaxial. X-ray diffraction measurements indicate that the diamond is monocrystalline. The measured FWHM of the first order Raman peak from the deposit is 3.4 cm$^{-1}$ and is comparable to that of the substrate. The original microcrack region containing amorphous carbon was still visible under the overlayer when viewed in transmission. The presence of amorphous carbon in the crack regions was confirmed by the 1600 cm$^{-1}$ band in the pre-deposition micro-Raman spectra. The epitaxial diamond deposition did not fill in the microcracks.

PL studies showed the presence of nitrogen-related optical centers at 1.945 eV (637 nm) and 2,156 eV (575 nm), indicating the presence of residual nitrogen in the deposition chamber. These centers have been attributed to single substitutional nitrogen and an interstitial nitrogen-vacancy complex respectively. The peak at 580 nm is the second order Raman mode, while the bands at 660 and 680 nm are vibrionic sidebands associated with the 1.945 eV (637 nm) center. The small peaks around 525 nm in the predeposition spectra are attributed to residual surface contaminants after sample cleaning. The nature of the features seen in the PL spectra was confirmed by changing the excitation wavelength from 514 to 458 nm. In the top view configuration, it is impossible to determine if there is an enhanced concentration of these nitrogen-related defects at the film/substrate interface.

Further controlled experiments included: inspection of the surface morphology of (100) and (111) faces by SEM, confirmation by x-ray or electron diffraction of the crystallographic orientation of the film, and spatially resolved Raman and PL measurements taken in a side-view configuration, that determined the film quality and defect concentration as a function of distance from the film/substrate interface.

This is the first time homoepitaxial deposition of a high quality diamond layer on a microcracked type IA natural diamond anvil by MPCVD has been accomplished. Raman analysis shows the crystallinity and phase purity of the deposit to be equal to that of the substrate. The rapid growth of the film over the central flat and culet of the brilliant cut anvil was highly anisotropic, but mirrors the geometry of the original anvil in that it shows a well-defined culet, bevel of approximately the same angle, and faceting. PL measurements show optical defect centers with ZPLs at 1.945 and 2.156 eV, due to the unintentional incorporation of nitrogen in substitutional and interstitial sites, respectively. Further analysis in a side-view configuration is necessary to determine if the concentration of either defect is a function of distance from the film/substrate interface. The 1.681 eV center, commonly seen from both polycrystalline and homoepitaxial diamond films is not seen in this film (while it is observed from films grown on isopure type IIa substrates in the same deposition run).

The production of a thick, faceted homoepitaxial diamond film on a natural type Ia diamond anvil, natural diamond containing nitrogen aggregates, by CVD has important implications for the realization of diamond-based electronics, as well as for the rapid and economical repair, modification, or enlargement of existing crystals for applications in other areas such as high pressure research. The present example illustrates the utility of the disclosed method by allowing the deposition of high quality monocrystalline diamond with a growth rate of 20 µm/hr which is vastly improved over currently disclosed techniques with growth rates of only 5 µm/hr.

The aspect of the invention shown in Example I is independent of that shown in Example II. Example I demonstrates the importance of the geometry of the substrate at low temperatures (below, e.g., 1600° C.) in forming monocrystalline diamond. It should be appreciated, however, the anvil used in Example I can be used in higher temperature regimes.

EXAMPLE II

Homoepitaxial Diamond Film Deposition on a Brilliant Cut Diamond Anvil at High Temperatures This example describes diamond deposition at substrate temperatures of from 2000°–2500° C. The homoepitaxial films were prepared as described in Example I. The films were grown using a precursor gas of 2% methane in hydrogen at a chamber pressure of 90 Torr with flow rates of 500 sccm for [CH$_4$] and 10 sccm for [H$_2$]. The total deposition time was 2 hours. The growth rate at high temperatures is very rapid and leads to the deposition of nanocrystalline graphite on the surface which is removed by etching in an atomic hydrogen plasma. Raman spectroscopy of the diamond layer showed a peak at 1332 cm$^{-1}$, the first order diamond Raman signal, and bands at 1430 and 1550 cm$^{-1}$, which are due to trace amounts of amorphous carbon on the surface of the layer, confirming that the film is the diamond form of carbon.

A Roughness Analysis of the film gave a roughness parameter of 51 nm. This is the film before polishing. The surface can be polished for further applications, if desired.

The growth was estimated to be at least 50 µm/hr. This is the lowest estimated rate, and the actual rate may be as high as 400 µm/hr. The quality of the diamonds is also very good, having a FWHM of 4.3 cm$^{-1}$ which is comparable to the best films produced by other methods. Additionally, formation at higher temperatures led to negligible incorporation of graphite into the final product. For example, the film produced by this method was clear, whereas that produced by the method of Example I was black due to the presence of graphite on the outer surface of the product film.

While the compositions and methods of this invention have been described in terms of preferred embodiments, it will be apparent to those of skill in the art that variations may be applied to the composition, methods and in the steps or in the sequence of steps of the method described herein without departing from the concept, spirit and scope of the invention. More specifically, it will be apparent that certain agents that are chemically related may be substituted for the agents described herein while the same or similar results would be achieved. All such similar substitutes and modifications apparent to those skilled in the art are deemed to be within the spirit, scope and concept of the invention as defined by the appended claims.

REFERENCES

The following references, to the extent that they provide exemplary procedural or other details supplementary to those set forth herein, are specifically incorporated herein by reference.

U.S. Pat. No. 5,112,458
U.S. Pat. No. 5,275,798
U.S. Pat. No. 5,292,371
Anthony (1990) *Mat. Res. Soc. Symp. Proc.* 162:68.
Bachmann and Lydtin (1991) in *Diamond and Diamond-Like Films and Coatings*. Edited by Clausing et al. Plenum. New York. pp. 829–853.
Bachmannn and Wechert (1991) in *Diamond and Diamond-Like Films and Coatings*. Edited by Clausing et al. Plenum. New York. pp. 678–701.
Behr et al. (1993) *Appl. Phys. Lett.* 63:3005.
Boppart et al. (1985) *Phys. Rev. B* 32:1423.
Burns and Davies (1992) in *The Properties of Natural and Synthetic Diamond*. Edited by Field. Academic. London. p. 405.
Clark et al. (1992) in *The Properties of Natural and Synthetic Diamond*. Edited by Field. Academic. London. pp. 35–80, 687–698.
Collins and Lawson (1989) *J. Phys. Condens. Matter* 7:6929.
Feng and Schwartz (1993) *J. Appl. Phys.* 73:1415.
Knight and White (1989) *J. Mater. Res.* 4:385.
Matsumoto et al. (1981) *Carbon* 19:232.
Pate (1986) *Surface Sci.* 165:83.
Ravi (1993) *Crit. Rev. Mater. Sci. Eng. B* 19:203.
Russel (1994) in *Synthetic Diamond: Emerging CVD Science and Technology*. Edited by Spear and Dismukes. Wiley. New York. pp. 627–649.
Sato and Kamo (1992) in *The Properties of Natural and Synthetic Diamond*. Edited by Field. Academic. London. pp. 445–467.
Seal (1987) in *High Pressure Research in Mineral Physics*. Edited by Mangmani and Syono. Terra Scientific. Tokyo. pp. 35–40.
Snail and Hanssen (1991) *J. Crystal Growth* 112:651.
Spitsyn et al. (1981) *J. Crystal Growth* 52:219.
Stemachulte et al. (1994) *Phys. Rev. B* 25:14554.
Van Eckevort (1994) in *Synthetic Diamond: Emerging CVD Science and Technology*. Edited by Spear and Dismukes. Wiley. New York. pp. 317–319.
Vohra et al. (1994) in *High Pressure Science and Technology*-1993. AIP Conf. Proc. No. 309, edited by Schmidt et al. AIP. New York. p. 515.
Vohra and McCauley (1994) *Diam. Relat. Mater.* 3:1087.
Vohra and Vagarali (1992) *Appl. Phys. Lett.* 61:2860.
Zhu et al. (1989) *J. Vacuum Sci. Technol.* A7:2315.

What is claimed is:

1. A method for the deposition of diamond films onto a substrate comprising:
   providing a diamond forming gas adjacent to a substrate in a sealed chamber,
   exposing the gas to microwave radiation to generate a plasma from the diamond forming gas that encompasses the substrate under conditions such that the diamond film forms on the substrate, wherein the temperature of the substrate is greater than about 1600° C.

2. The method of claim 1 wherein the substrate is boron nitride, molybdenum, or diamond.

3. The method of claim 1 wherein the substrate is diamond.

4. The method of claim 1 wherein the substrate is an anvil shaped diamond.

5. The method of claim 1 wherein the substrate is mounted on a molybdenum stage.

6. The method of claim 1 wherein the substrate is a brilliant cut diamond.

7. The method of claim 1 wherein the diamond forming gas comprises a carbon containing substance and a carrier substance.

8. The method of claim 7 wherein the carbon containing substance is a hydrocarbon of up to about 5 carbon atoms.

9. The method of claim 7 wherein the hydrocarbon is acetylene, ethylene, propane or methane.

10. The method of claim 7 wherein the hydrocarbon is methane.

11. The method of claim 1 wherein the diamond forming gas comprises up to about 50% of a carbon containing substance.

12. The method of claim 1 wherein the diamond forming gas comprises from about 1 to about 10% of a carbon containing substance.

13. The method of claim 1 wherein the diamond forming gas comprises from about 1 to about 3% of a carbon containing substance.

14. The method of claim 13 wherein the carbon containing substance is methane.

15. The method of claim 7 wherein the carrier substance is hydrogen.

16. The method of claim 1 wherein the substrate is maintained at a temperature of from about 2000° C. to about 2500° C.

17. The method of claim 1 wherein the substrate is maintained at a temperature of from about 2200° C. to about 2500° C.

18. The method of claim 1 wherein the plasma is generated by application of direct current or radio frequency or microwave radiation.

19. The method of claim 1 wherein the plasma is generated by microwave radiation.

20. The method of claim 7, further comprising exposing the diamond film to a plasma generated from hydrogen which etches any graphite formed during the process to thereby remove the graphite from the diamond film.

21. The method of claim 1 wherein a pressure of less than about 150 Torr is maintained.

22. The method of claim 1 wherein the substrate and plasma are positioned within a sealed chamber.

23. A method for the deposition of diamond film onto a substrate comprising:

providing a diamond forming gas containing methane and hydrogen adjacent to a diamond substrate in a sealed chamber;

exposing the gas to microwave radiation to generate a plasma that encompasses the diamond substrate having a temperature in the range from about 2200° C. to about 2500° C. under conditions such that the diamond film forms on the surface of the diamond substrate.

24. The method of claim 23 wherein the concentration of methane is from about 1 to about 3%.

25. The method of claim 23 wherein a pressure of less than about 150 Torr is maintained.

26. The method of claim 23 wherein the substrate and plasma are positioned within a sealed chamber.

27. The method of claim 23 wherein the diamond substrate has a brilliant cut geometrical structure.

28. The method of claim 23 wherein the substrate has a tip extending into the plasma.

29. The method of claim 23 wherein the hydrogen etches any graphite formed during the process to thereby remove the graphite from the diamond film being produced.

30. A method for the production of monocrystalline diamond, comprising:

providing a diamond forming gas adjacent to a diamond substrate in a sealed chamber;

exposing the gas to microwave radiation to generate a plasma that encompasses the diamond anvil substrate, the substrate having a tip extending into the plasma, under conditions such that the monocrystalline diamond forms on the tip of the substrate.

31. The method of claim 30 wherein the substrate is maintained at a temperature in the range from about 1000° C. to about 1500° C.

32. The method of claim 30 wherein a pressure of less than about 150 Torr is maintained.

33. The method of claim 30 wherein the method is conducted in the absence of air.

* * * * *